(12) United States Patent
Byeon et al.

(10) Patent No.: US 7,626,448 B2
(45) Date of Patent: Dec. 1, 2009

(54) INTERNAL VOLTAGE GENERATOR

(75) Inventors: Sang-Jin Byeon, Kyoungki-do (KR); Jae-Hyuk Im, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 292 days.

(21) Appl. No.: 11/528,650

(22) Filed: Sep. 28, 2006

(65) Prior Publication Data
US 2007/0070761 A1  Mar. 29, 2007

(30) Foreign Application Priority Data
Sep. 28, 2005 (KR) .................. 10-2005-0090850
Dec. 29, 2005 (KR) .................. 10-2005-0134010

(51) Int. Cl.
G05F 1/10 (2006.01)
(52) U.S. Cl. ........................... 327/540; 327/538
(58) Field of Classification Search ............ 327/530, 327/538–541, 362, 378
See application file for complete search history.

(56) References Cited

U.S. PATENT DOCUMENTS

| | | | |
|---|---|---|---|
| 3,906,386 A * | 9/1975 | Hongu et al. | 330/289 |
| 4,727,269 A * | 2/1988 | Luich | 327/51 |
| 4,825,142 A * | 4/1989 | Wang | 323/314 |
| 5,157,285 A | 10/1992 | Allen | |
| 5,686,825 A | 11/1997 | Suh et al. | |
| 6,232,828 B1 | 5/2001 | Smith et al. | |
| 6,501,299 B2 | 12/2002 | Kim et al. | |
| 6,903,601 B1 | 6/2005 | Aude | |
| 7,019,508 B2 * | 3/2006 | Rategh et al. | 323/314 |
| 7,116,129 B2 * | 10/2006 | Pan et al. | 326/32 |
| 2005/0023710 A1 | 2/2005 | Brodkin et al. | |

FOREIGN PATENT DOCUMENTS

| | | |
|---|---|---|
| JP | 2003-114728 A | 4/2003 |
| JP | 2003-197764 A | 7/2003 |
| KR | 0107779 | 5/1994 |
| KR | 10-1994-0007298 B1 | 8/1994 |
| KR | 1020000061319 | 10/2000 |

OTHER PUBLICATIONS

Korean Notice of Preliminary Rejection with Partial English Translation issued in Korean Patent Application No. 10-2005-0134010 dated on Apr. 23, 2008.
Korean Office Action, with English Translation, issued in Korean Patent Application No. KR 10-2005-0134010, dated Oct. 30, 2008.

* cited by examiner

Primary Examiner—Dinh T. Le
(74) Attorney, Agent, or Firm—IP & T Law Firm PLC

(57) ABSTRACT

An internal voltage generator includes: an internal voltage driving unit for supplying an internal voltage corresponding to a reference voltage maintaining a predetermined voltage level regardless of a temperature variation; and a temperature compensation current sinking unit for sinking a current generated by an internal voltage in response to a voltage level inversely proportional to a temperature.

29 Claims, 6 Drawing Sheets

INTERNAL VOLTAGE GENERATOR

FIELD OF THE INVENTION

The present invention relates to a method for designing a semiconductor device, and more particularly, to an internal voltage generator capable of supplying a stable internal voltage while a temperature varies.

DESCRIPTION OF RELATED ARTS

As high speed and low power consumption have been increasingly required for semiconductor devices, the semiconductor memory devices have generated an internal voltage through a down converting method or a charge pumping method. Each of the semiconductor memory devices uses an appropriate internal voltage in a core region and a peripheral region. Then, power consumed in the semiconductor device can be reduced by using the internal voltage at a standby mode and an active mode.

If the internal voltage has a voltage level lower than the external voltage VDD, a level of the internal voltage which is an operating voltage can be easily maintained when the semiconductor memory device operates. Thus, there are advantages in reliability of the devices.

Each of the semiconductor memory devices includes a plurality of internal voltage generators according to whether it is at an active mode consuming a great quantity of current or at a standby mode consuming a relatively small quantity of current to minimize power consumption.

FIG. 1 is a block diagram of a typical internal voltage generator.

The typical internal voltage generator includes a reference voltage supplying unit 10 for supplying a reference voltage VREF having a predetermined voltage level regardless of a temperature variation, and a standby mode internal voltage supplying unit 20 for supplying an internal voltage VINT with a voltage level corresponding to the reference voltage VREF.

FIG. 2A is a diagram of the reference voltage supplying unit 10 shown in FIG. 1. FIG. 2B is a graph of a property of a negative voltage V− of a negative voltage generator 30 changing with a temperature as shown in FIG. 2A. The negative voltage V− has a property that a voltage difference between an emitter of a bipolar transistor and a base of the bipolar transistor is inversely proportional to the temperature. FIG. 2C is a graph of a positive voltage V+ of a positive voltage generator 40 changing with a temperature as shown in FIG. 2A. The positive voltage V+ is generated by using two emitters of bipolar transistors and has a property proportional to the temperature.

Referring to FIG. 2A, the reference voltage supplying unit 10 includes a negative voltage generator 30 outputting the negative voltage V− having a negative temperature coefficient and the positive voltage generator 40 outputting the positive voltage V+ having a positive temperature coefficient. The reference voltage supplying unit 10 can supply a reference voltage VREF having a predetermined voltage level regardless of a temperature variation.

FIG. 3 is an internal circuit diagram of a negative voltage generator having the same property as shown in FIG. 2B.

The negative voltage generator includes a bipolar junction transistor (BJT) having a base and an emitter connected to a terminal of a ground voltage VSS, and a resistance R connected between a terminal of a power supply voltage VDD and an emitter of the bipolar junction transistor (BJT). Accordingly, the negative voltage generator outputs a voltage, i.e., the negative voltage V−, at the emitter of the bipolar junction transistor (BJT).

The negative voltage V− of the negative voltage generator shown in FIG. 3 has a negative temperature coefficient.

FIG. 4 is a circuit diagram of a standby mode internal voltage supplying unit 20 shown in FIG. 1.

The standby mode internal voltage supplying unit 20 includes an internal voltage driver 22 for supplying an internal voltage VINT, a feed back unit 24 for outputting a feed back voltage VINT_FD, a driving control unit 26 for controlling the internal voltage driver 22, and a capacitor unit 28 for preventing a noise from fluctuation of the internal voltage VINT.

The driving control unit 26 is inactivated during a test mode. However, the driving control unit 26 becomes activated at a non-test mode, receives the reference voltage VREF and the feed back voltage VINT_FD as differential inputs, and outputs a driving control signal DRV.

The feed back unit 24 includes P-type metal oxide semiconductor (PMOS) transistors in series. The feed back unit 24 divides the internal voltage VINT and outputs the divided internal voltage VINT as the feed back voltage VINT_FD.

The capacitor unit 28 includes a capacitor CP1 disposed between a terminal of the internal voltage VINT and an output terminal of the feed back unit 24, and a capacitor CN1 disposed between the output terminal of the feed back unit 24 and a supplying terminal of a ground voltage VSS.

Hereinafter, the operation of the standby mode internal voltage supplying unit 20 will be examined.

If the feed back voltage VINT_FD is lower than the reference voltage VREF, the driving control unit 26 reduces a voltage level of the driving control signal DRV. Thus, the internal voltage driver 22 increases the level of the internal voltage VINT.

The feed back unit 24 divides the internal voltage VINT and outputs the divided internal voltage VINT as the feed back voltage VINT_FD. The driving control unit 26 receiving the feed back voltage VINT_FD controls a voltage level of the driving control signal DRV by comparing a voltage level of the reference voltage VREF with that of the feed back voltage VINT_FD. The above described steps are repeated until the feed-back voltage VINT_FD has a voltage level corresponding to the reference voltage VREF.

The feed back unit 24 divides the internal voltage VINT through the active resistances embodied in the PMOS transistors.

Since the semiconductor memory device does not perform a read operation or a writing operation at a standby mode, the semiconductor memory device needs to be designed to decrease possible current consumption. Particularly, if the feed back unit 24 is used in the semiconductor memory device for low power, the feed back unit 24 should decrease current consumption.

Resistance values of the active resistances of the PMOS transistor are increased by decreasing a channel width and increasing a channel length, thereby to minimize a current consumption of the feed back unit 24.

If an ambient temperature becomes lower and noise is transferred to the feed back unit 24, the internal voltage VINT supplied by the typical internal voltage generator fluctuates. Particularly, the internal voltage VINT increases. Thus, faulty operation may occur in blocks where the internal voltage VINT is used.

If the ambient temperature becomes lower, current which the typical internal voltage generator consumes is increased. However, since the feed back unit 24 is designed to allow only the small quantity of the current flow, it takes a lot of time to make the internal voltage VINT stable if the internal voltage VINT fluctuates.

If the ambient temperature is not low, although the noise is generated in the feed back unit 24, the voltage level of the internal voltage VINT can be stably maintained within a short period.

If the voltage level of the internal voltage VINT is excessively increased, faulty operation may occur in the blocks where the internal voltage VINT is used.

FIG. 5 illustrates a typical level detecting unit for detecting a voltage level of a power supply voltage VBB by using an internal voltage VINT.

If a voltage level of the power supply voltage VBB in the level detecting unit is increased, a voltage level of the internal voltage VINT is also increased due to a coupling effect.

Although the power supply voltage VBB has a stable voltage level after a predetermined time has passed, it takes several tens ms time to stabilize the increased voltage level of the internal voltage VINT. Accordingly, the level detecting unit may improperly operate due to the increased voltage level of the internal voltage VINT, although the voltage level of the power voltage VBB is stabilized.

The typical internal voltage generator may be designed without considering a driving property of devices changing with temperature. Accordingly, the typical internal voltage generator may provide an unstable voltage level of an internal voltage VINT while a temperature varies.

SUMMARY OF THE INVENTION

It is, therefore, an object of the present invention to provide an internal voltage generator capable of supplying a stable voltage level of an internal voltage while a temperature varies.

In accordance with one aspect of the present invention, there is provided an internal voltage generator, including: an internal voltage driving unit for supplying an internal voltage corresponding to a reference voltage maintaining a predetermined voltage level regardless of a temperature variation; and a temperature compensation current sinking unit for sinking a current generated by an internal voltage in response to a voltage level inversely proportional to temperature.

In accordance with another aspect of the present invention, there is provided an internal voltage generator, including: a internal voltage driving unit for supplying an internal voltage corresponding to a reference voltage maintaining a predetermined voltage level regardless of a temperature variation; and a temperature compensation current sinking unit for sinking a current generated by an internal voltage in response to a voltage level proportional to temperature.

In accordance with a further aspect of the present invention, there is provided a semiconductor memory device, including: a control unit for comparing a reference signal with a feed back signal and outputting a control signal; an internal voltage outputting unit for outputting an internal voltage having a predetermined level to an output unit in response to the control signal, and the feed back signal corresponding to the internal voltage; and a current sinking unit for sinking a current generated at an output unit by the internal voltage in response to a temperature compensation signal of which a voltage level varies in response to a temperature variation.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

Figure 1:
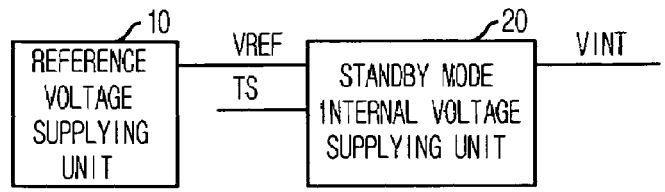
FIG. 1 is a block diagram of a typical internal voltage generator.
Figure 2A:
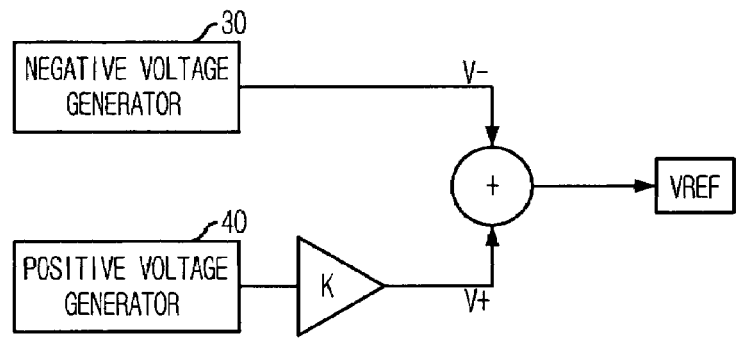
FIG. 2A is a diagram of a reference voltage supplying unit shown in FIG. 1.
Figure 2B:
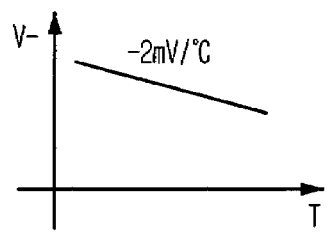
FIG. 2B is a graph illustrating a property of a negative voltage V− changing with a temperature shown in FIG. 2A.
Figure 2C:
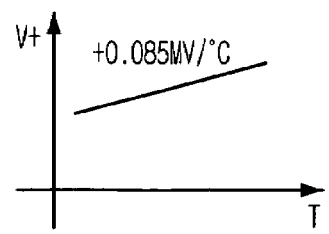
FIG. 2C is a graph illustrating a property of a positive voltage V+ changing with a temperature shown in FIG. 2A.
Figure 3:
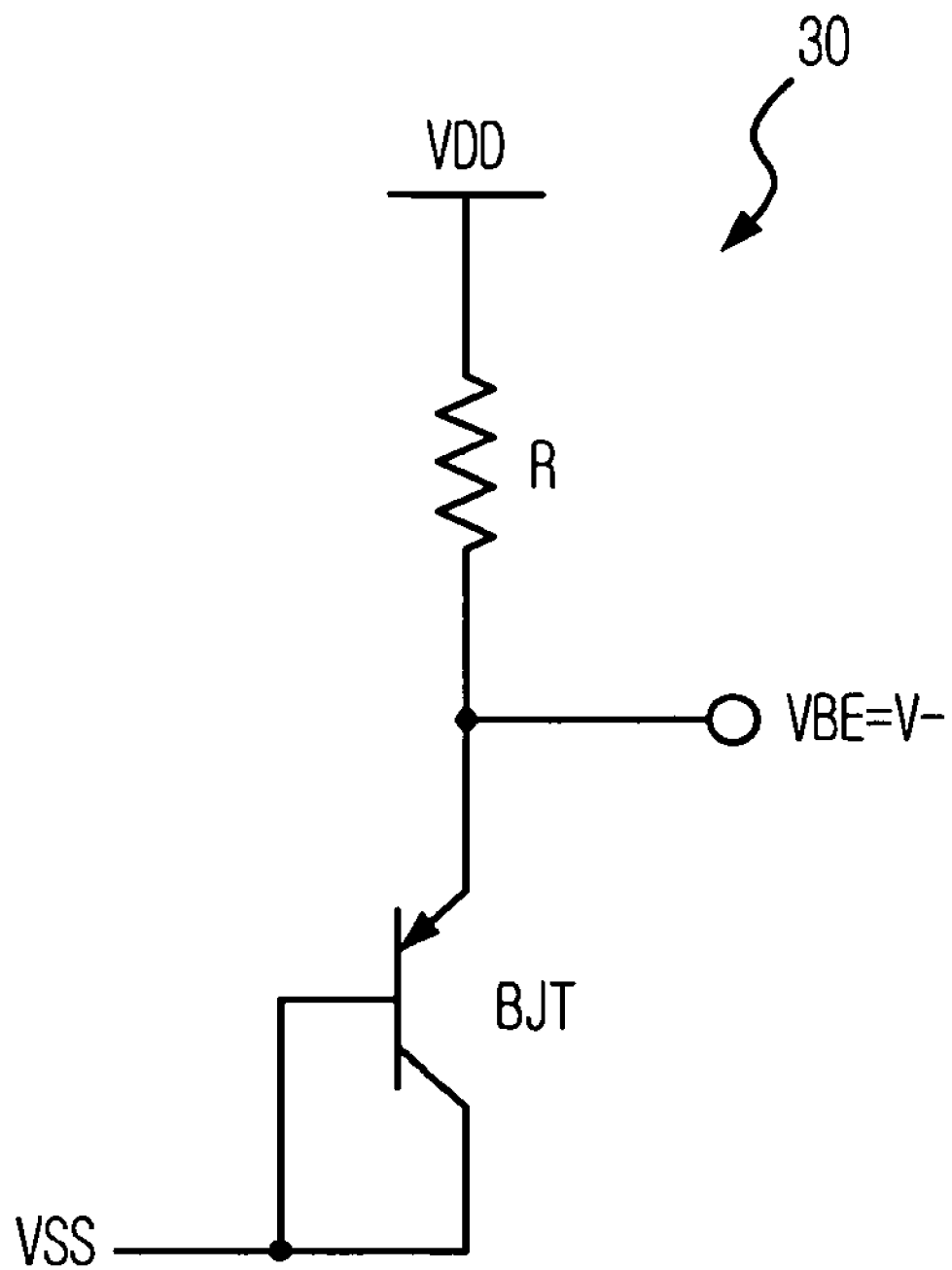
FIG. 3 is an internal circuit diagram of a negative voltage generator having the same property as shown in FIG. 2B.
Figure 4:
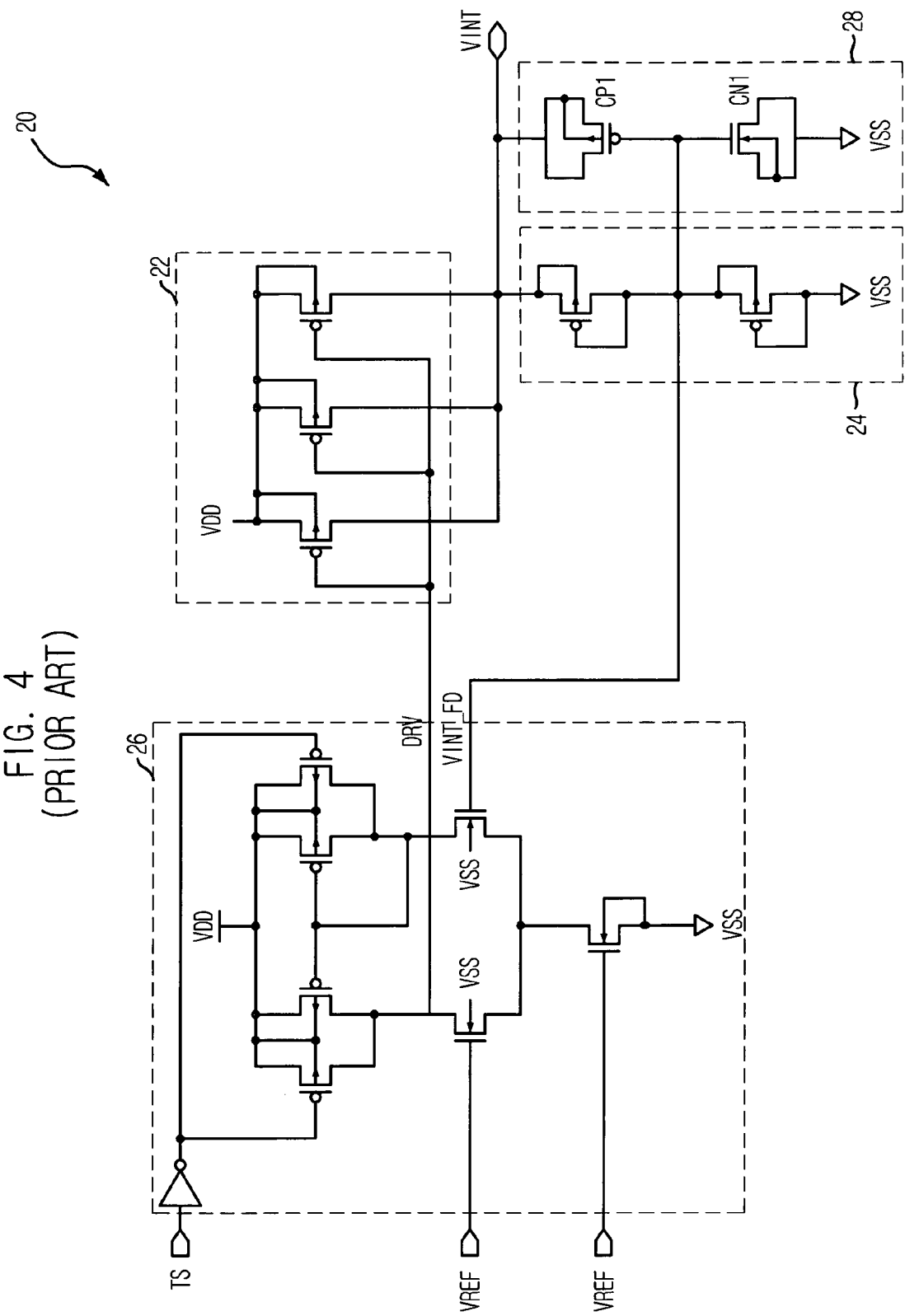
FIG. 4 is an internal circuit diagram of a standby mode internal voltage supplying unit shown in FIG. 1.
Figure 5:
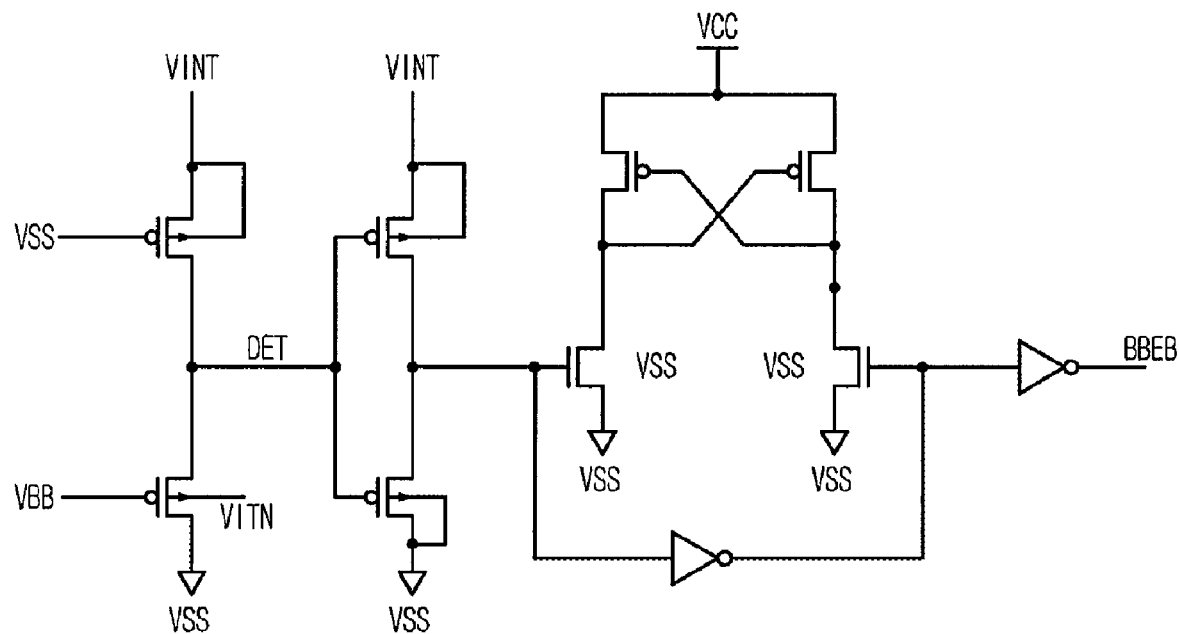
FIG. 5 is a circuit diagram of a typical level detecting unit for detecting a level of a power supply voltage VBB by using an internal voltage VINT.
Figure 6:
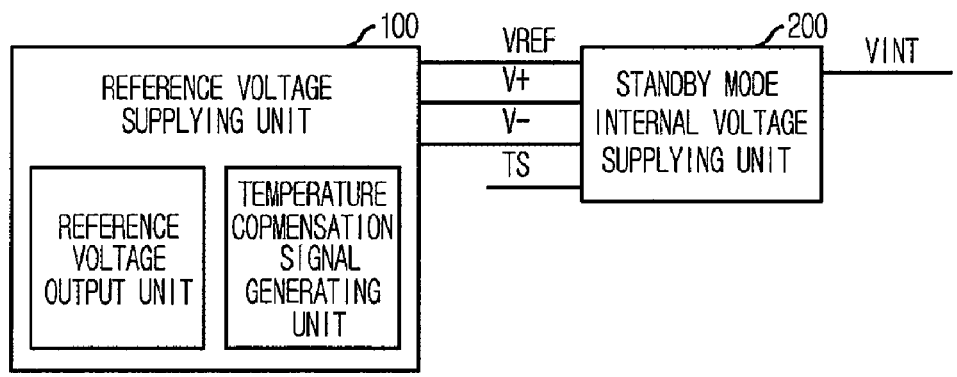
FIG. 6 is a block diagram illustrating an internal voltage generator in accordance with an embodiment of the present invention.

FIG. 6 is a block diagram illustrating an internal voltage generator in accordance with an embodiment of the present invention.

The internal voltage generator in accordance with the embodiment of the present invention includes a reference voltage supplying unit 100 for generating a reference voltage VREF having a predetermined voltage level regardless of a temperature, and temperature compensation signals V+ and V− having voltage levels changing with a temperature, and a standby mode internal voltage supplying unit 200 for supplying an internal voltage VINT corresponding to the reference voltage VREF and sinking a current generated by the supplied internal voltage VINT according to the voltage levels of the temperature compensation signals V+ and V−.

The reference voltage supplying unit 100 may include a reference voltage output unit and a temperature compensation signal generating unit. The reference voltage output unit controls coefficients of output signals of a first device having a voltage property proportional to temperature and a second device having a voltage property inversely proportional to temperature. Also, the reference voltage output unit outputs a reference voltage having a predetermined voltage level regardless of temperature. The temperature compensation signal generating unit controls coefficients of output signals of a third device having a voltage property proportional to temperature and a fourth device having a voltage property inversely proportional to temperature. Also, the temperature compensation signal generating unit outputs a temperature compensation signal having a voltage property inversely proportional to a temperature variation.

The reference voltage supplying unit 100 outputs the temperature compensation signals V+ and V− having the voltage levels changing with a variable temperature and an internal voltage supplying unit controls an amount of a sinking current generated by the internal voltage VINT in response to the temperature compensation signals V+ and V−.

An internal voltage generator can provide an unstable level of an internal voltage since an amount of a sinking current may vary due to a property of an internal voltage supplying unit changing with temperature. However, the internal voltage generator in accordance with the embodiment of the present invention can reduce variation in an amount of the sinking current generated by the internal voltage VINT through the temperature compensation signals V+ and V− having the voltage levels changing with a temperature.

Figure 7:
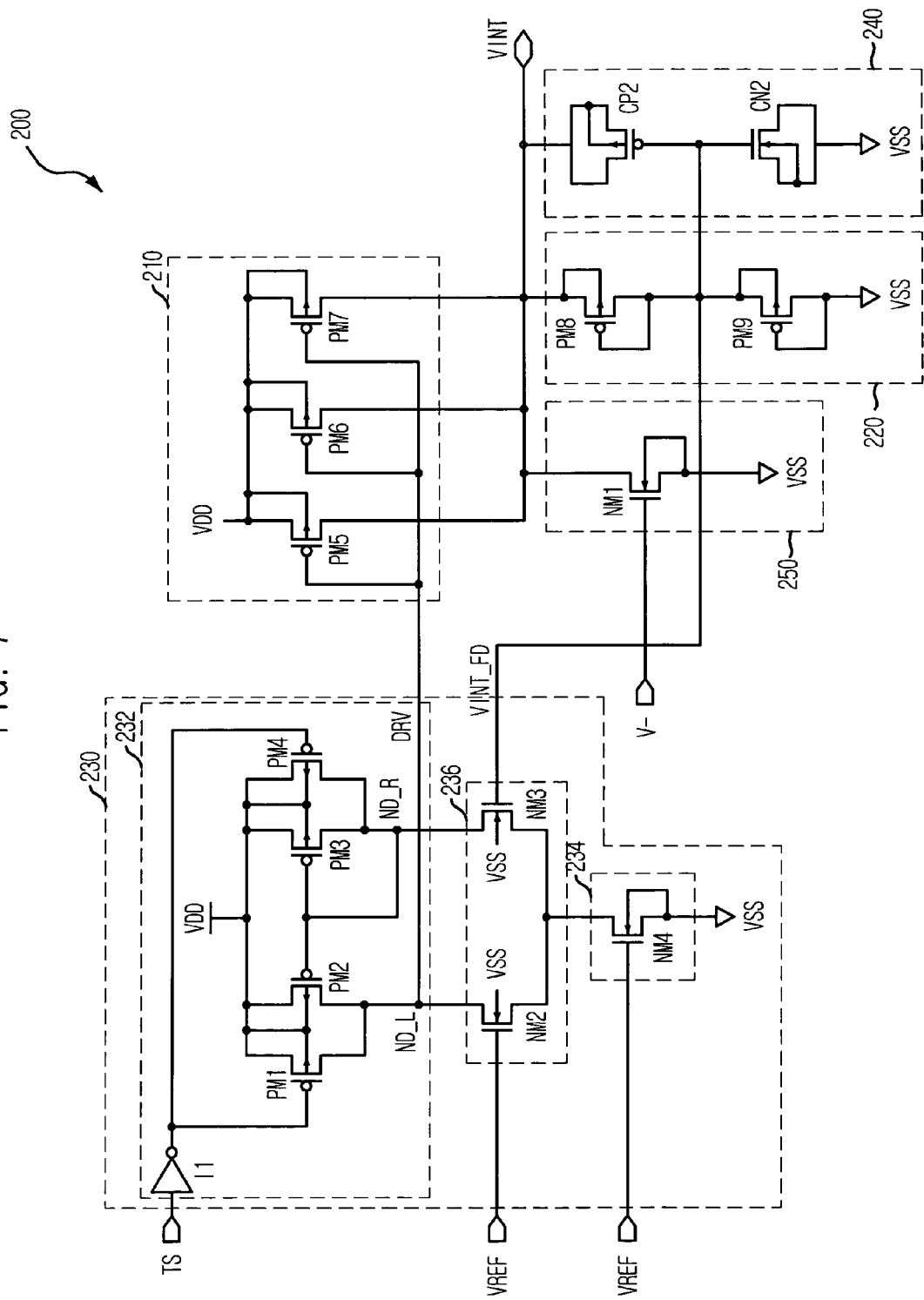
FIG. 7 is an internal circuit diagram of a standby mode internal voltage supplying unit in accordance with a first exemplary embodiment of the present invention.

FIG. 7 illustrates the standby mode internal voltage supplying unit shown in FIG. 6 in accordance with a first exemplary embodiment of the present invention.

The standby mode internal voltage supplying unit 200A includes an internal voltage driving unit 210 for supplying an internal voltage VINT, and a temperature compensation current sinking unit 250 for sinking a current generated by the internal voltage VINT in response to a voltage level of a temperature compensation signal V−.

The temperature compensation current sinking unit 250 includes a N-type metal oxide semiconductor (NMOS) transistor NM1 receiving the temperature compensation signal V− through a gate and having a drain-source path between a terminal of an internal voltage VINT and a terminal of a ground voltage VSS.

The internal voltage driving unit 210 increases a voltage level in response to a driving control signal DRV. A feed back unit 220 outputs a feed back voltage VINT_FD, wherein the feed back voltage VINT_FD is a voltage reduced by a predetermined voltage from the internal voltage VINT. A driving control unit 230 controls the internal voltage driving unit 210 to make the feed-back voltage VINT_FD have an internal voltage level corresponding to the reference voltage VREF. A capacitor unit 240 prevents noise from fluctuation of the internal voltage VINT.

The internal voltage driving unit 210 includes first to third P-type metal oxide semiconductor (PMOS) transistors PM5, PM6, and PM7 receiving the driving control signal DRV through a gate and respectively having source-drain paths between a terminal of an external voltage VDD and the terminal of the internal voltage VINT.

The feed back unit 220 includes first and second PMOS transistors PM8 and PM9. The first and second PMOS transistors PM8 and PM9 are coupled in series between the terminal of the internal voltage VINT and the terminal of the ground voltage VSS. A voltage maintained in a connection node of the first and second PMOS transistors PM8 and PM9 is output as the feed back voltage VINT_FD.

The capacitor unit 240 includes a first capacitor CP2 embodied in a PMOS transistor and a second capacitor CN2 embodied in a NMOS transistor. The first capacitor CP2 and the second capacitor CN2 are coupled in series between the terminal of the internal voltage VINT and the terminal of the ground voltage VSS.

The driving control unit 230 includes a current mirror unit 232 for supplying a current at a non-test mode, a bias supplying unit 234 for supplying a bias current in response to the reference voltage VREF, and an input unit 236 for receiving the reference voltage VREF and the feed back voltage VINT_FD as differential inputs and controlling an amount of the current of the current mirror unit 232.

The bias supplying unit 234 includes a NMOS transistor NM4 receiving the reference voltage through a gate and having one terminal coupled to the terminal of the ground voltage VSS and the other terminal coupled to the input unit 236.

The input unit 236 includes a NMOS transistor NM2 receiving the reference voltage VREF through a gate and having a drain-source path between a node ND_L and a node ND, and a NMOS transistor NM3 receiving the feed back voltage VINT_FD through a gate and having a drain-source path between a node ND_R and a node ND.

The current mirror unit 232 includes an inverter I1 for reversing a test signal TS, a PMOS transistor PM1 receiving an output signal of the inverter I1 through a gate and having a source-drain path between the terminal of the external voltage VDD and the node ND_L, a PMOS transistor PM4 receiving an output signal of the inverter I1 through a gate and having a source-drain path between the terminal of the external voltage VDD and the node ND_R, and a plurality of PMOS transistors PM2 and PM3 respectively having source-drain paths between the terminal of the external voltage VDD and the node ND_L, and between the terminal of the external voltage VDD and the node ND_R.

Hereinafter, an operation of the internal voltage generator shown in FIG. 7 will be explained.

If a test signal TS is activated as a logic level 'H', the PMOS transistors PM1 and PM4 are turned on. Then, the nodes ND_L and ND_R become higher to a voltage level of the external voltage VDD and thus, the driving control signal DRV becomes the logic level 'L'.

If the test signal TS is inactivated as a logic level 'L', the PMOS transistors PM1 and PM4 are turned off and thus, the current mirror unit 232 can be enabled.

The current mirror unit 232 supplies the current into the nodes ND_L and ND_R through the PMOS transistors PM2 and PM3. The reference voltage VREF is provided to a gate of the NMOS transistors NM2 and NM4. The feed back voltage VINT_FD is provided to the gate of the NMOS transistor NM3.

The current through the NMOS transistor NM2 becomes greater than the current through the NMOS transistor NM3 if the voltage level of the feed back voltage VINT_FD is lower than that of the reference voltage VREF. Since the current mirror unit 232 supplies the same amount of the current to the NMOS transistors NM2 and NM3, the voltage level of the node ND_L decreases. Accordingly, the internal voltage driving unit 210 increases an amount of the supplied internal voltage VINT due to the decreased driving control signal DRV to increase the voltage level of the internal voltage VINT.

The internal voltage driving unit 210 controls the internal voltage VINT until the voltage levels of the reference voltage VREF and the feed back voltage VINT_FD become the same.

If the voltage level of the feed back voltage VINT_FD increases more than that of the reference voltage VREF, the voltage level of a node ND_R decreases and the voltage level of the node ND_L increases. Hence, the voltage level of the driving control signal DRV increases, and the PMOS transistors PM5, PM6, and PM7 of the internal voltage driving unit 210 are turned off.

Since the voltage level of the internal voltage VINT is decreased due to the current of the internal voltage VINT sinking by the feed back unit 220 and the temperature compensation sinking unit 250, the reference voltage VREF and the feed back voltage VINT_FD are maintained at the same level.

Particularly, the temperature compensation current sinking unit 250 increases an amount of the sinking current in proportion to the voltage level of the temperature compensation signal V−.

If temperature is decreased at the standby mode and noise is generated, an amount of the current sinking at the terminal of the internal voltage VINT is increased. The amount of the current sinking by the temperature compensation current sinking unit 250 is increased due to the temperature compensation signal V−. Accordingly, the voltage level of the internal voltage VINT can be stable within a short period.

The temperature compensation signal V− has a voltage level inversely proportionate to temperature due to the reference voltage supplying unit 100 (see FIG. 6).

Figure 8:
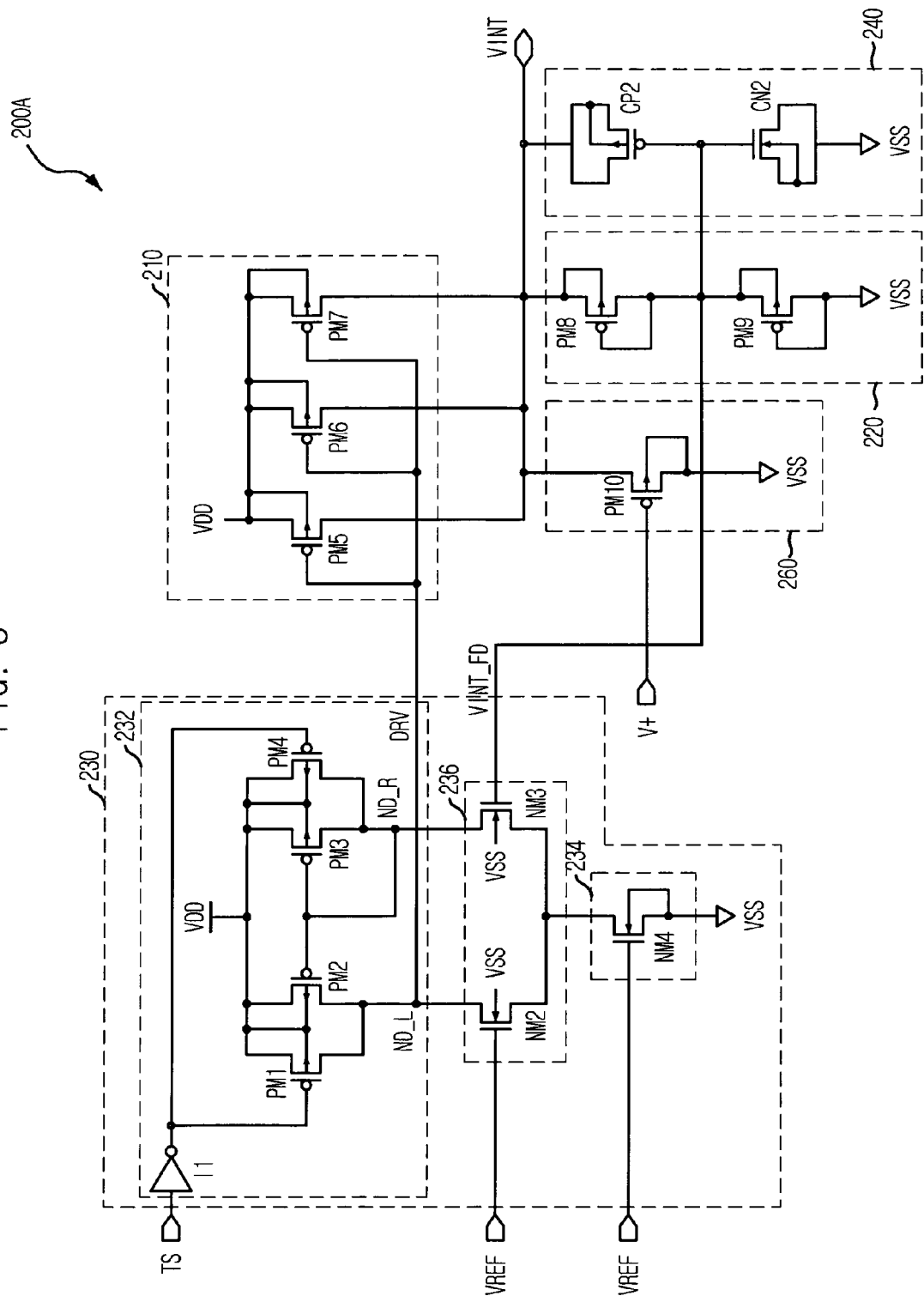
FIG. 8 is an internal circuit diagram of a standby mode internal voltage supplying unit shown in accordance with a second exemplary embodiment of the present invention.

FIG. 8 is a circuit diagram of a standby mode internal voltage supplying unit in accordance with a second exemplary embodiment of the present invention. Herein, the standby mode internal voltage supplying unit in accordance with the second exemplary embodiment of the present invention will be compared with that in accordance with the first exemplary embodiment of the present invention. The same reference numerals used in FIG. 7 are also used to denote the same elements in FIG. 8.

The standby mode internal voltage supplying unit 200A in accordance with the second embodiment of the present invention includes the same circuit as the standby mode internal voltage supplying unit 200 in accordance with the first exemplary embodiment of the present invention. However, the standby mode internal voltage supplying unit 200A receives a temperature compensation signal V+ having a voltage level in proportion to a temperature to thereby control a temperature current sinking unit 260.

The temperature compensation current sinking unit 260 includes a PMOS transistor PM10 receiving the temperature compensation signal V+ through a gate, and having a drain-source path between a terminal of an internal voltage VINT and a terminal of a ground voltage VSS.

If temperature is decreased at a standby mode and noise is generated, an amount of the current sinking at the terminal of the internal voltage VINT can be increased. An amount of current sinking by the temperature compensation current sinking unit 260 increases by the temperature compensation signal V+. Accordingly, a voltage level of the internal voltage VINT can be stable within a short period.

The temperature compensation signal V+ has a voltage level proportional to temperature. This voltage level can be generated by a reference voltage supplying unit 100 (see FIG. 6).

As described above, an internal voltage generator receives a signal having a voltage level changing with temperature, and controls an amount of a sinking current of the terminal of an internal voltage VINT according to the voltage level of the temperature compensation signals V− and V+. Accordingly, a voltage level of the internal voltage VINT can be stable although a temperature varies.

Although circuits for supplying an internal voltage VINT at a standby mode are exemplified in these exemplary embodiments of the present invention, a concept of the present invention, in which control of an amount of a sinking current of a power supplied depending on a variable temperature, is not limited to modes in which an internal voltage VINT is used.

According to the embodiments of the present invention, temperature compensation signals are generated through devices having a temperature property in a reference voltage supplying unit.

According to the embodiment of the present invention, it is possible to supply an internal voltage with a stable level by controlling an amount of a sinking current according to variable temperatures.

The present application contains subject matter related to the Korean patent application Nos. KR 2005-0090850 and 2005-0134010, respectively filed in the Korean Patent Office on Sep. 28, 2005 and Dec. 29, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An internal voltage generator, comprising:
   a reference voltage supplying unit configured to generate a reference voltage and temperature compensation signals in response to a positive voltage and a negative voltage, wherein the reference voltage has a predetermined voltage level regardless of a temperature variation, wherein the positive voltage has a voltage level proportional to the temperature variation, and the negative voltage has a voltage level inversely proportional to the temperature variation; and
   an internal voltage supplying unit configured to receive the reference voltage and to generate at an output an internal voltage corresponding to the reference voltage; and
   a temperature compensation current sinking unit configured to receive a temperature compensation signal of the temperature compensation signals based on the negative voltage and to sink a current of the internal voltage at the output in response to a voltage level of the temperature compensation signal, thereby maintaining the voltage level of the internal voltage to be stable regardless of the temperature variation.

2. The internal voltage generator of claim 1, wherein the temperature compensation current sinking unit includes a first N-type metal oxide semiconductor (NMOS) transistor receiving the temperature compensation signal through a gate and having a drain-source path between a terminal of the internal voltage and a supplying terminal of a ground voltage.

3. The internal voltage generator of claim 1, wherein the reference voltage supplying unit includes:
   a reference voltage output unit configured to control coefficients of the positive voltage having a voltage property proportional to a temperature and the negative voltage having a voltage property inversely proportional to a temperature and to output outputting the reference voltage having a predetermined voltage level regardless of a temperature; and
   a temperature compensation signal generating unit and configured to output a temperature compensation signal having a voltage property inversely proportional to a temperature variation.

4. The internal voltage generator of claim 3, wherein the internal voltage driving unit includes:
   an internal voltage driving unit for supplying the internal voltage;
   a feed back unit for outputting a feed back voltage having a predetermined voltage level to the internal voltage;
   a driving control unit for controlling an operation of the internal voltage driving unit to make the feed back voltage correspond to the reference voltage; and
   a capacitor unit for preventing noise from affecting the internal voltage.

5. The internal voltage generator of claim 4, wherein the feed back unit includes a plurality PMOS transistors coupled with each other in series between a terminal of the internal voltage and a terminal of the ground voltage, and outputs a voltage maintained in a connection node of the PMOS transistors as the feed back voltage.

6. The internal voltage generator of claim 5, wherein the capacitor unit includes a plurality of capacitors embodied in MOS transistors and coupled with each other in series between the terminal of the internal voltage and the supplying terminal of the ground voltage.

7. The internal voltage generator of claim 6, wherein the internal voltage driving unit includes first to third PMOS transistors receiving the driving control signal through a gate and respectively having source-drain paths between a terminal of an external voltage and the terminal of the internal voltage.

8. The internal voltage generator of claim 7, wherein the driving control unit includes:
   a current mirror unit for supplying a current at a non-test mode;
   a bias supplying unit for supplying a bias current in response to the reference voltage; and
   an input unit for receiving the reference voltage and the feed back voltage as differential inputs and controlling an amount of the current of the current mirror unit to thereby output the reference voltage and the feed back voltage as the driving control signal.

9. The internal voltage generator of claim 8, wherein the bias supplying unit includes a first NMOS transistor receiving the reference voltage through a gate, and having one terminal of the second NMOS transistor coupled to the supplying terminal of the ground voltage and the other terminal of the second NMOS transistor coupled to the input unit.

10. The internal voltage generator of claim 9, wherein the input unit includes:
   a second NMOS transistor for receiving the reference voltage through a gate and having a drain-source path between a first node and the other terminal of the first NMOS transistor; and
   a third NMOS transistor for receiving the feed back voltage through a gate and having a drain-source path between a second node and the other terminal of the first NMOS transistor.

11. The internal voltage generator of claim 10, wherein the current mirror unit includes:
   a first inverter for reversing a test signal;
   a fourth PMOS transistor for receiving an output signal of the first inverter through a gate and having a source-drain path between the supplying terminal of the external voltage and the first node;
   a fifth PMOS transistor for receiving the output signal of the first inverter through a gate and having a source-drain path between the supplying terminal of the external voltage and the second node; and
   a sixth PMOS transistor and a seventh PMOS transistor for respectively having source-drain paths between the terminal of the external voltage and the first node and between the supplying terminal of the external voltage and the second node.

12. An internal voltage generator, comprising:
   a reference voltage supplying unit configured to generate a reference voltage and temperature compensation signals in response to a positive voltage and a negative voltage, wherein the reference voltage has a predetermined voltage level regardless of a temperature variation, wherein the positive voltage has a voltage level proportional to the temperature variation, and the negative voltage has a voltage level inversely proportional to the temperature variations; and
   a internal voltage driving unit configured to receive the reference voltage and to generate at an output an internal voltage corresponding to the reference voltage and including a temperature compensation current sinking unit configured to receive a temperature compensation signal of the temperature compensation signal based on the positive voltage and to sink a current of the internal voltage at the ouput in the response to the voltage level of the temperature compensation signal, thereby maintaining the voltage level of the internal voltage to be stable regardless of the temperature variation.

13. The internal voltage generator of claim 12, wherein the temperature compensation current sinking unit includes a first P-type metal oxide semiconductor (PMOS) transistor receiving the temperature compensation signal through a gate and having a drain-source path between a terminal of the internal voltage and a terminal of a ground voltage.

14. The internal voltage generator of claim 12, wherein the reference voltage supplying unit includes:
   a reference voltage output unit configured to control coefficients of the positive voltage having a voltage property proportional to a temperature and the negative voltage having a voltage property inversely proportional to temperature and to output the reference voltage having the predetermined voltage level regardless of a temperature; and
   a temperature compensation signal generating unit configured to control coefficients of the positive voltage having a voltage property proportional to a temperature and to output a temperature compensation signal having a voltage property proportional to a temperature variation.

15. The internal voltage generator of claim 14, wherein the internal voltage supply unit includes:
   an internal voltage driving unit for supplying the internal voltage;
   a feed back unit for outputting a feed back voltage having a predetermined voltage level to the internal voltage;
   a driving control unit for controlling an operation of the internal voltage driving unit to make the feed back voltage correspond to the reference voltage; and
   a capacitor unit for preventing noise affecting the internal voltage.

16. The internal voltage generator of claim 15, wherein the feed back unit includes a plurality of PMOS transistors coupled with each other in series between the supplying terminal of the internal voltage and a terminal of the ground voltage, and outputs a voltage maintained in a connection node of the PMOS transistors as the feed back voltage.

17. The internal voltage generator of claim 16, wherein the capacitor unit includes a plurality of capacitors embodied in MOS transistors and coupled with each other in series between the supplying terminal of the internal voltage and the supplying terminal of the ground voltage.

18. The internal voltage generator of claim 17, wherein the driver includes second to fourth PMOS transistors receiving the driving control signal through a gate and respectively having source-drain paths between a terminal of an external voltage and the terminal of the internal voltage.

19. The internal voltage generator of claim 18, wherein the driving control unit includes:
   a current mirror unit for supplying a current at a non-test mode;
   a bias supplying unit for supplying a bias current in response to the reference voltage; and
   an input unit for receiving the reference voltage and the feed back voltage as differential inputs and controlling an amount of the current of the current mirror unit to thereby output the reference voltage and the feed back voltage as the driving control signal.

20. The internal voltage generator of claim 19, wherein the bias supplying unit includes a first NMOS transistor receiving the reference voltage through a gate, and having one terminal of the first NMOS transistor coupled to the supplying terminal of the ground voltage and the other terminal of the first NMOS transistor coupled to the input unit.

21. The internal voltage generator of claim 20, wherein the input unit includes:
   a second NMOS transistor for receiving the reference voltage through a gate and having a drain-source path between a first node and the other terminal of the first NMOS transistor; and
   a third NMOS transistor for receiving the feed back voltage through a gate and having a drain-source path between a second node and the other terminal of the first NMOS transistor.

22. The internal voltage generator of claim 21, wherein the current mirror unit includes:
   a first inverter for reversing a test signal;
   a fifth PMOS transistor for receiving an output signal of the first inverter through a gate and having a source-drain path between the supplying terminal of the external voltage and the first node;
   a sixth PMOS transistor for receiving the output signal of the first inverter through a gate and having a source-drain path between the supplying terminal of the external voltage and the second node; and
   a seventh PMOS transistor and an eighth PMOS transistor for respectively having source-drain paths between the supplying terminal of the external voltage and the first node and between the terminal of the external voltage and the second node.

23. A semiconductor memory device, comprising:
   a reference voltage supplying unit configured to generate a reference voltage and temperature compensation signals in response to a positive voltage and a negative voltage, wherein the reference voltage has a predetermined voltage level regardless of a temperature variation, wherein the positive voltage has a voltage level proportional to the temperature variation, and the negative voltage has a voltage level inversely proportional to the temperature variation;
   a control unit configured to compare the reference voltage with a feed back voltage and outputting a control signal as a comparison result;
   an internal voltage outputting unit configured to output at an output an internal voltage having a predetermined level to an output unit in response to the control signal, the feed back signal corresponding to the internal voltage; and
   a current sinking unit configured to sink a current of the internal voltage at the output in response to a temperature compensation signal of the compensation signals, each of which has a voltage level varying in response to the temperature variation.

24. The semiconductor memory device of claim 23, wherein the internal voltage is a voltage for a standby mode of the semiconductor memory device.

25. The semiconductor memory device of claim 23, wherein one of the temperature compensation signal is proportional to a temperature variation.

26. The semiconductor memory device of claim 23, wherein one of the temperature compensation signal is inversely proportional to a temperature variation.

27. An internal voltage generator, comprising:
   reference voltage supplying unit configured to generate a reference voltage and temperature compensation signals in response to a positive voltage and a negative voltage, wherein the reference voltage has a predetermined voltage level regardless of a temperature, wherein the positive voltage level is a voltage level proportional to the temperature variation, and the negative voltage level is a voltage level inversely proportional to the temperature variation; and
   a standby mode internal voltage supplying unit configured to receive the reference voltage and the temperature compensation signals, to generate at an output an internal voltage in response to the reference voltage, and said standby mode voltage supplying unit including a current sinking unit to sink a current generated by the internal voltage at the output in response to voltage levels of the temperature compensation signals.

28. The internal voltage generator of claim 27, wherein the reference voltage supplying unit includes:
   a reference voltage output unit configured to control coefficients of output signals of the positive voltage having a voltage property proportional to a temperature and the negative voltage having a voltage property inversely proportional to a temperature and to output a reference voltage having a predetermined voltage level regardless of a temperature; and
   a temperature compensation signal generating unit configured to control coefficients of the positive voltage of a third device having a voltage property proportional to temperature and the negative voltage having a voltage property inversely proportional to temperature and to output a temperature compensation signal having a voltage property inversely proportional to a temperature variation.

29. The internal voltage generator of claim 27, wherein the standby mode internal voltage supplying unit includes:
   an internal voltage driving unit configured to receive the reference voltage and to supply an internal voltage corresponding to the reference voltage;
   a feed back unit configured to output a feed back voltage having a predetermined voltage level to the internal voltage;
   a driving control unit configured to control an operation of the internal voltage driving unit to make the feed buck voltage correspond to the reference voltage;
   a capacitor unit configured to prevent noise from affecting the internal voltage; and
   a temperature compensation current sinking unit configured to sink a current of the internal voltage in response to a voltage level of the temperature compensation signal and to maintain the voltage level of the internal voltage to be stable regardless of the temperature variation.

* * * * *